(12) United States Patent
Kajiwara et al.

(10) Patent No.: US 7,528,489 B2
(45) Date of Patent: May 5, 2009

(54) SEMICONDUCTOR APPARATUS AND MANUFACTURING METHOD

(75) Inventors: Ryouichi Kajiwara, Hitachi (JP); Kazutoshi Itou, Hitachi (JP); Hidemasa Kagii, Takasaki (JP); Hiroi Oka, Tamamura (JP); Hiroyuki Nakamura, Maebashi (JP)

(73) Assignee: Renesas Technology Corp., Tokyo (JP)

(*) Notice: Subject to any disclaimer, the term of this patent is extended or adjusted under 35 U.S.C. 154(b) by 343 days.

(21) Appl. No.: 11/324,315

(22) Filed: Jan. 4, 2006

(65) Prior Publication Data

US 2006/0151889 A1 Jul. 13, 2006

(30) Foreign Application Priority Data

Jan. 7, 2005 (JP) ............................. 2005-002016

(51) Int. Cl.
H01L 35/08 (2006.01)

(52) U.S. Cl. .................... 257/772; 257/712; 420/560

(58) Field of Classification Search .......... 257/720, 257/700, 712, 772; 148/23; 420/560
See application file for complete search history.

(56) References Cited

U.S. PATENT DOCUMENTS 4,929,516 A 5/1990 Pryor et al.
5,990,545 A * 11/1999 Schueller et al. ............ 257/697
2002/0012608 A1 * 1/2002 Takaoka et al. ............. 420/561
2004/0061221 A1 * 4/2004 Schaffer ..................... 257/723

FOREIGN PATENT DOCUMENTS

| CN | 86101652 A | 3/1986 |
| JP | A-5-308083 A | 11/1993 |
| JP | 2001-127076 | 5/2001 |
| JP | A-2002-93828 A | 3/2002 |
| JP | 2003-290976 | 10/2003 |
| JP | A-2003-290976 A | 10/2003 |

* cited by examiner

Primary Examiner—Marcos D. Pizarro
Assistant Examiner—Eva Y. Montalvo
(74) Attorney, Agent, or Firm—Antonelli, Terry, Stout & Kraus, LLP.

(57) ABSTRACT

Pb free solder is used in die bonding. A thermal stress reduction plate is disposed between a semiconductor chip and a die pad made of a Cu alloy. The semiconductor chip and the thermal stress reduction plate are joined and the thermal stress reduction plate and the die pad are joined by a joint material of Pb free solder having Sn—Sb—Ag—Cu as its main constituent elements and having a solidus temperature not lower than 270° C. and a liquidus temperature not higher than 400° C. Thus, die bonding can be performed using the Pb free solder without generating any chip crack.

11 Claims, 12 Drawing Sheets

FIG.5

| No. | JOINT MATERIAL (No.1-15: EMBODIMENTS) | THERMAL STRESS REDUCTION PLATE/ PLATE THICKNESS (mm) | JOINING TEMPERATURE | CHIP CRACKING | 260°C REFLOW | TEMPERATURE CYCLE | TOTAL DECISION |
|---|---|---|---|---|---|---|---|
| 1 | Sn-33Sb-15Ag-10Cu | CIC(1:1:1)/0.2t | 360 | NO | ○ | >1000 | ○ |
| 2 | Sn-36Sb-15Ag-10Cu | ↑ | 360 | NO | ○ | >1000 | ○ |
| 3 | Sn-37Sb-8Ag-7Cu | ↑ | 360 | NO | ○ | >1000 | ○ |
| 4 | Sn-40Sb-10Ag-5Cu | ↑ | 380 | NO | ○ | >1000 | ○ |
| 5 | Sn-35Sb-15Ag-10Cu | CIC(1:1:1)/0.5t | 360 | NO | ○ | >1000 | ○ |
| 6 | Sn-35Sb-15Ag-10Cu | CIC(1:2:1)/0.1t | 360 | NO | ○ | >1000 | ○ |
| 7 | Sn-35Sb-15Ag-10Cu | LCOP50/0.2t | 360 | NO | ○ | >1000 | ○ |
| 8 | Bi-5Ag-5Sb | CIC(1:1:1)/0.2t | 320 | NO | ○ | >1000 | ○ |
| 9 | Bi-20Ag-5Sb | ↑ | 360 | NO | ○ | >1000 | ○ |
| 10 | Bi-25Ag-5Sb | ↑ | 380 | NO | ○ | >1000 | ○ |
| 11 | Bi-10Ag-10Sb | ↑ | 350 | NO | ○ | >1000 | ○ |
| 12 | Bi-10Ag-20Sb | ↑ | 360 | NO | ○ | >1000 | ○ |
| 13 | Bi-10Ag-5Sb | CIC(1:2:1)/0.1t | 350 | NO | ○ | >1000 | ○ |
| 14 | Bi-10Ag-5Sb | LCOP50/0.2t | 350 | NO | ○ | >1000 | ○ |
| 15 | Bi-10Ag-5Sb | CI MIXED MATERIAL /0.2t | 350 | NO | ○ | >1000 | ○ |
| COMPARATIVE EXAMPLES (No.16-25) | | | | | | | |
| 16 | Sn-45Sb-15Ag-10Cu | CIC(1:1:1)/0.2t | >400 | × | — | — | × |
| 17 | Sn-20Sb-25Ag | CIC(1:1:1)/0.2t | >400 | NO | × | — | × |
| 18 | Sn-40Sb-20Ag | CIC(1:1:1)/0.2t | >400 | × | — | — | × |
| 19 | Sn-33Sb-15Ag-10Cu | NO | 360 | × | — | — | × |
| 20 | Sn-33Sb-15Ag-10Cu | CIC(1:3:1)/0.2t | 360 | NO | ×※1) | — | × |
| 21 | Bi-20Ag | CIC(1:1:1)/0.2t | 380 | NO | × | — | × |
| 22 | Bi-20Ag | NO | 380 | NO | × | — | × |
| 23 | Bi-10Ag-3Sb | CIC(1:1:1)/0.2t | 330 | NO | × | — | × |
| 24 | Bi-10Ag-10Sb | NO | 350 | △ | ○ | — | × |
| 25 | Bi-10Ag-30Sb | CIC(1:1:1)/0.2t | >400 | × | — | — | × |

NOTE:
- CIC: THREE-LAYER PLATE OF Cu/Fe-Ni alloy/Cu
- LCOPX: COMPOSITE MATERIAL OF Cu-Cu2O(Xvol%)
- TEMPERATURE CYCLE: (cycle), CONDITION: -55/150°C
- JOINING TEMPERATURE: (°C)
- ※1): EXFOLIATION BETWEEN DIE PAD AND REDUCTION PLATE

| No. | COMPOSITION (wt%) | | | MELTING POINT (°C) | |
|---|---|---|---|---|---|
| | Bi | Ag | Sb | SOLIDUS | LIQUIDUS |
| COMPARATIVE EXAMPLE A | 76.0 | 24.0 | 0.0 | 262 | 400 |
| COMPARATIVE EXAMPLE B | 90.0 | 10.0 | 0.0 | 262 | 350 |
| COMPARATIVE EXAMPLE C | 80.3 | 9.7 | 3.0 | 265 | 358 |
| EXAMPLE A | 80.5 | 9.5 | 5.0 | 270 | 363 |
| EXAMPLE B | 81.0 | 9.0 | 10.0 | 280 | 375 |
| EXAMPLE C | 72.0 | 8.0 | 20.0 | 300 | 400 |

SEMICONDUCTOR APPARATUS AND MANUFACTURING METHOD

BACKGROUND OF THE INVENTION

The present invention relates to a semiconductor apparatus and a technique for manufacturing the same, and particularly relates to a technique effective in application to Pb free solder for fixing a semiconductor device.

A background-art alloy member for die bonding uses a pure Al plate or a 42 alloy material 0.05-0.5 mm thick as a substrate, and an alloy joint layer 0.005-0.1 mm thick is provided on each surface of the substrate.

Further, a Pb free alloy having a liquidus temperature not higher than 400° C. and a solidus temperature not lower than 280° C. or a Pb free alloy having a liquid-phase volume ratio not higher than 15% at 280° C. is used as the alloy joint layer (e.g. JP-A-2001-127076 (pp. 2-3)).

The following four items are important to properties of a solder material applicable to die bonding for a semiconductor apparatus. The first item is a condition as to a process temperature. To make it possible to perform die bonding at 400° C. or lower, the liquidus temperature must be not higher than 400° C., and the wettability with a lead frame material must be excellent. The second item is a condition that the solder material must have heat resistance high enough to be proof against heating and cooling at 260° C. when the semiconductor apparatus is secondarily assembled. Thus, the solidus temperature must be not lower than 270° C. The third item is a condition that when an Si chip is joined to a die pad of a Cu alloy, a solder joint layer must relax thermal strain caused by a difference in thermal expansion so as to prevent the Si chip from being damaged due to thermal stress. The fourth items is a condition that the thermal fatigue life of the solder joint layer must be enough long relatively to a temperature variation caused by heating of the semiconductor device.

A ZnAl based solder material such as a ZnAlGe material or a ZnAlMgGa material known in the background art has solidus and liquidus temperatures at 309° C. and 347° C. or 359° C. and 375° C., satisfying the condition that the process temperature in die bonding must be not higher than 400° C. and the condition that the heat-resistant must reach 260° C. in the secondary assembling process. However, the coefficient of thermal expansion of the solder material is high, and the material is so hard that the elastic modulus or the yield strength is high. Thus, there arises a problem that the chip may be cracked. In addition, the wettability with a lead frame material of Ni or Cu is low due to Al forming a solid oxide film on the solder material. Thus, there is a problem that excellent die bonding cannot be performed.

On the other hand, SnSbAg (15-20 wt %) solder satisfies the condition as to the process temperature not higher than 400° C. in die bonding or the condition as to the die bonding property, and the condition as to prevention of chip cracking due to thermal stress. However, the solidus temperature of the SnSbAg solder is 250° C., lower than the liquidus temperature ranging from 280° C. to 315° C. Therefore, the solder material is partially fused in the assembling process carried out at 260° C., so that an external force to exfoliate the chip by cracking is given to the chip due to thermal expansion of resin serving as an encapsulant at that time. Thus, there is a problem that the chip exfoliates by cracking at the solder joint layer. Further, in a temperature cycle test where a temperature change caused by heating of the semiconductor device is simulated, there is a problem on the temperature cycle reliability because exfoliation by cracking due to fatigue occurs in the SnSb solder in a short time so that the electric properties of the device deteriorate suddenly. SnSb (20-40 wt %) solder has problems as follows. That is, the solder is so hard that chip cracking occurs. The solidus temperature of the solder is 250° C. so that the solder cannot sustain reflow at 260° C. SnSb (not lower than 43 wt %) has a problem as follows. That is, the liquidus reaches 400° C. or higher so that die bonding is difficult at 400° C. or lower.

JP-A-2001-127076 discloses jointing alloys such as ZnAl based alloys, ZnSn based alloys, AuSn based alloys, AuGe based alloys, etc. However, any Zn based alloy has a problem that its wettability is low, and any Au based alloy has a problem that its cost is high.

SUMMARY OF THE INVENTION

An object of the present invention is to provide a technique by which Pb free solder can be used in die bonding.

The aforementioned and other objects and novel features of the present invention will be clarified in the description of this specification and the accompanying drawings.

Of the invention disclosed herein, the summary of exemplars will be described briefly below.

That is, according to the present invention, a means for reducing thermal stress is disposed between a semiconductor device and a die pad, and the semiconductor device and the means for reducing thermal stress are joined through Pb free solder having Sn—Sb—Ag—Cu or Bi—Ag—Sb as its primary constituent elements, wherein the solidus temperature is not lower than 270° C. and the liquidus temperature is not higher than 400° C.

In addition, according to the present invention, paste or granular Pb free solder is supplied onto a die pad of a lead frame and fused, and a thermal stress reduction plate lower in thermal expansion, lower in yield stress and lower in elastic modulus than a Cu alloy is joined and fixed further by the solder. After that, the paste or granular Pb free solder is supplied onto the thermal stress reduction plate and fused. A semiconductor device is disposed further on the solder on the thermal stress reduction plate, and joined and fixed by this solder. After that, electrodes of the semiconductor device are electrically connected to leads of the lead frame.

Effect obtained by the exemplars of the invention disclosed herein will be described briefly below.

It is possible to attain application of Pb free solder while preventing chip cracking in die bonding.

The other objects, features and advantages of the present invention will be clarified in the following description of embodiments of the present invention relevant to the accompanying drawings.

BRIEF DESCRIPTION OF THE DRAWINGS

FIG. 5 is a result data table showing an example of evaluation results of the semiconductor apparatus according to the embodiment of the present invention, in which a thermal stress reduction plate and solder incorporated in the semiconductor apparatus were set as parameters.

DESCRIPTION OF THE EMBODIMENTS

In the following embodiments, it will be made a rule not to describe parts the same as or similar to each other redundantly if not necessary especially.

Further, the following embodiments will be described as a plurality of sections or embodiments if necessary for the sake of convenience. Without any specific provision, those are not independent of one another, but there is a relationship in which one of them is a modification, a detail, a supplementary explanation, or the like, of a part or all of the others.

The following embodiments will refer to numbers of elements and the like (including numbers, numerical values, amounts, ranges, etc.). In such a case, the embodiments will be not limited to the specified numbers unless they are clearly expressed or they are limited to the specified numbers clearly in principle. Assume that those numbers may be not smaller than the specified numbers or not larger than the specified numbers.

The embodiments of the present invention will be described below in detail with reference to the drawings. Members having the same functions as each other will be referenced correspondingly all over the drawings for explaining the embodiments, and redundant description thereof will not be omitted.

Embodiments

Figure 1:
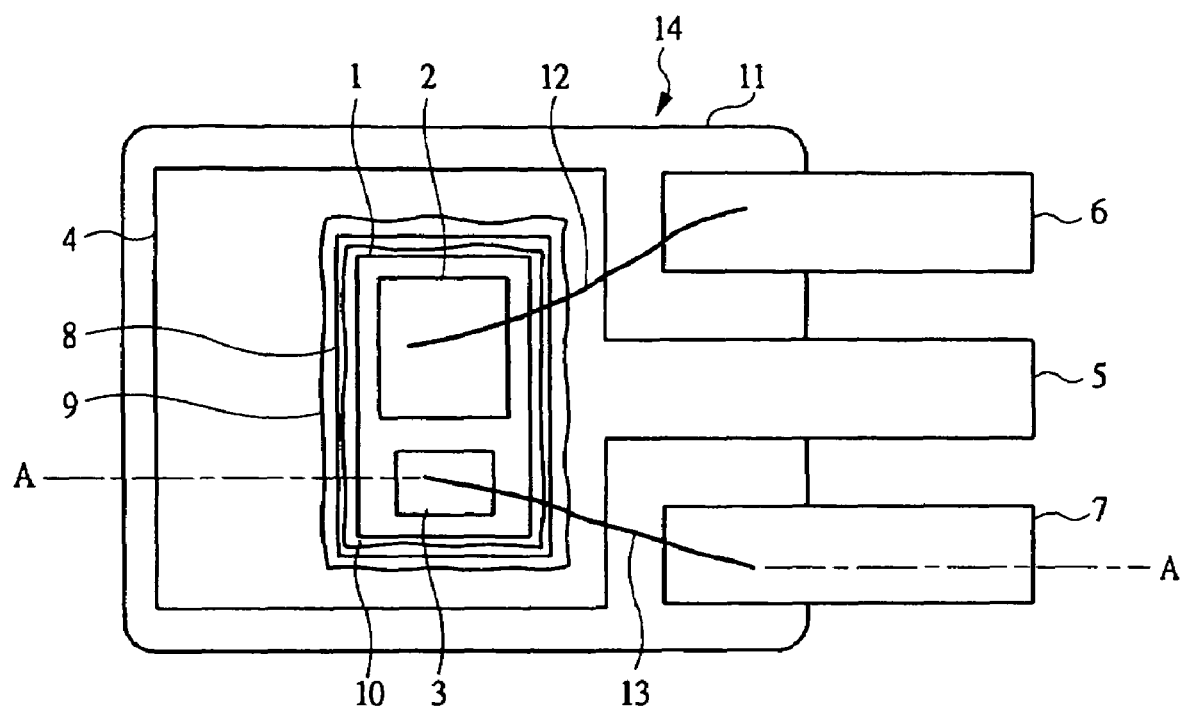
FIG. 1 is a plan view showing an example of an internal structure of a semiconductor apparatus according to an embodiment of the present invention with an encapsulant regarded as transparent.
Figure 2:
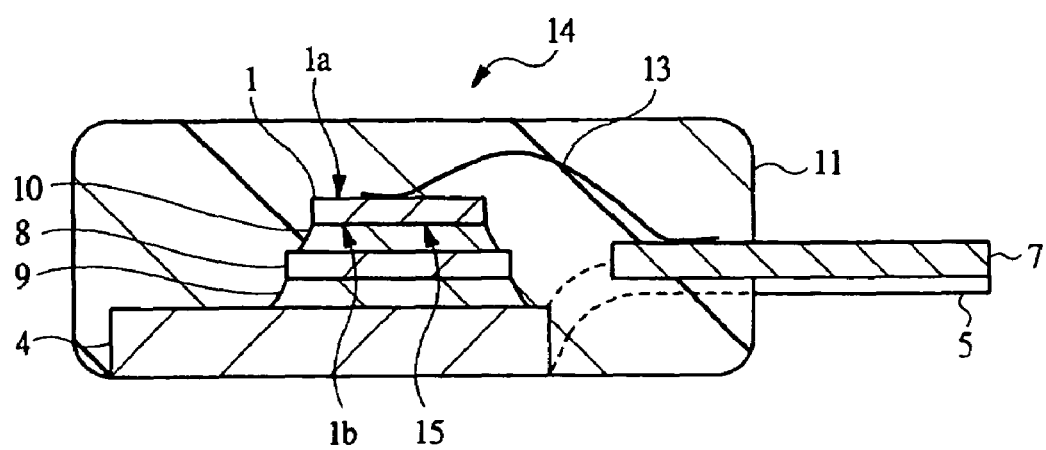
FIG. 2 is a sectional view showing the sectional structure taken on line A-A in FIG. 1.
Figure 3A:
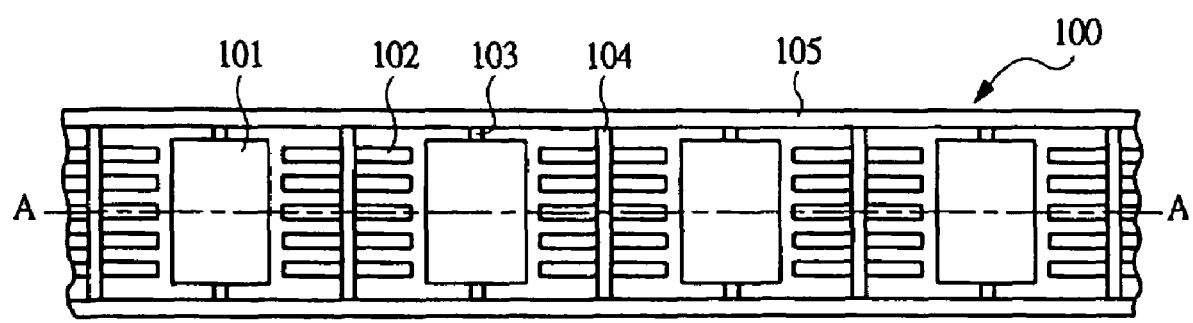
FIG. 3A is a partial plan view showing an example of the structure of a lead frame used for assembling the semiconductor apparatus according to the embodiment of the present invention.
Figure 3B:
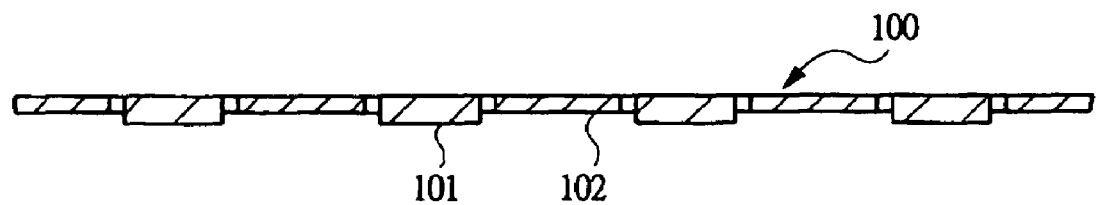
FIG. 3B is a partial sectional view showing a sectional structure of the same taken on line A-A in FIG. 3A.
Figure 4:
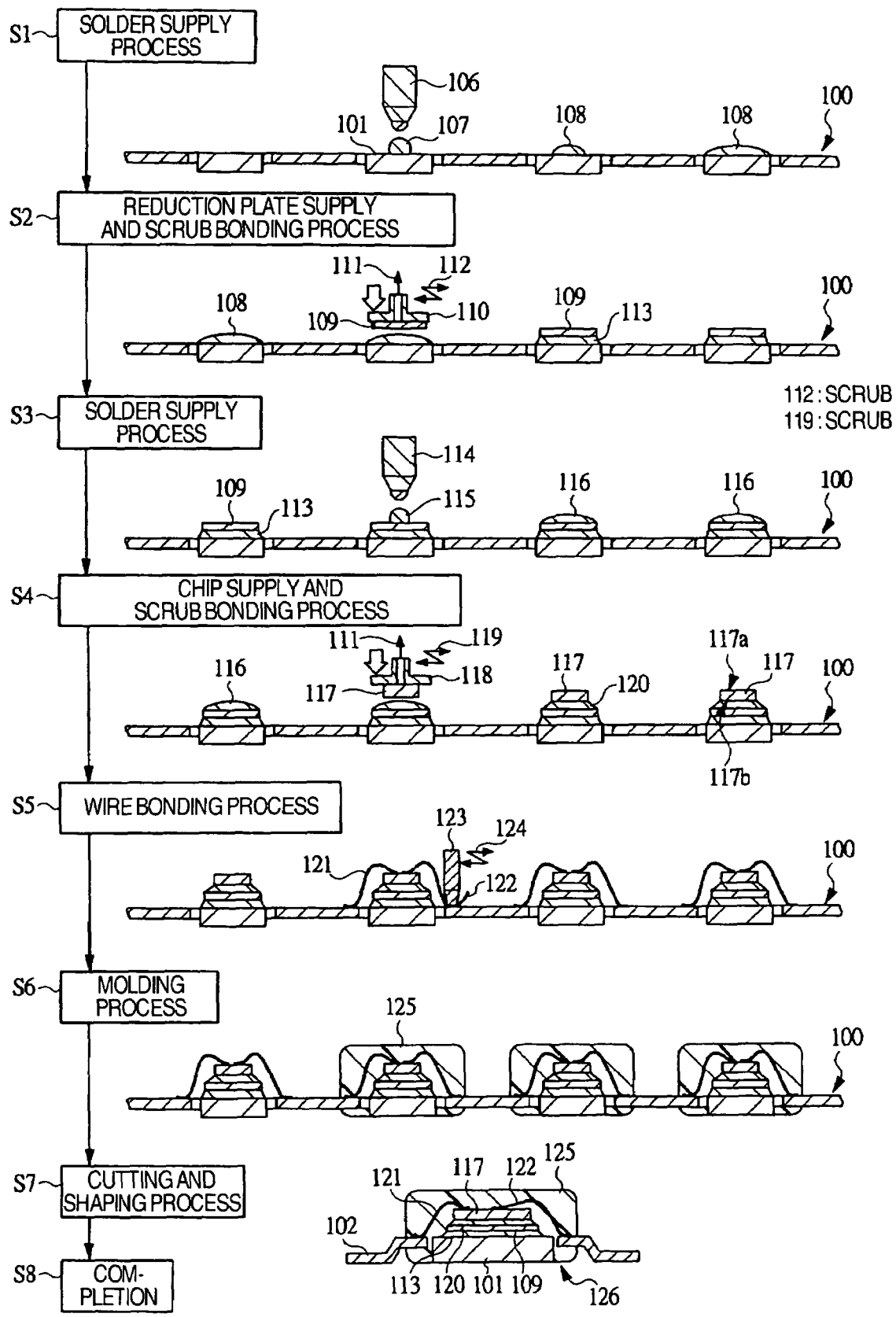
FIG. 4 is a manufacturing process flow chart showing an example of an assembling procedure of the semiconductor apparatus according to the embodiment of the present invention.
Figure 6:
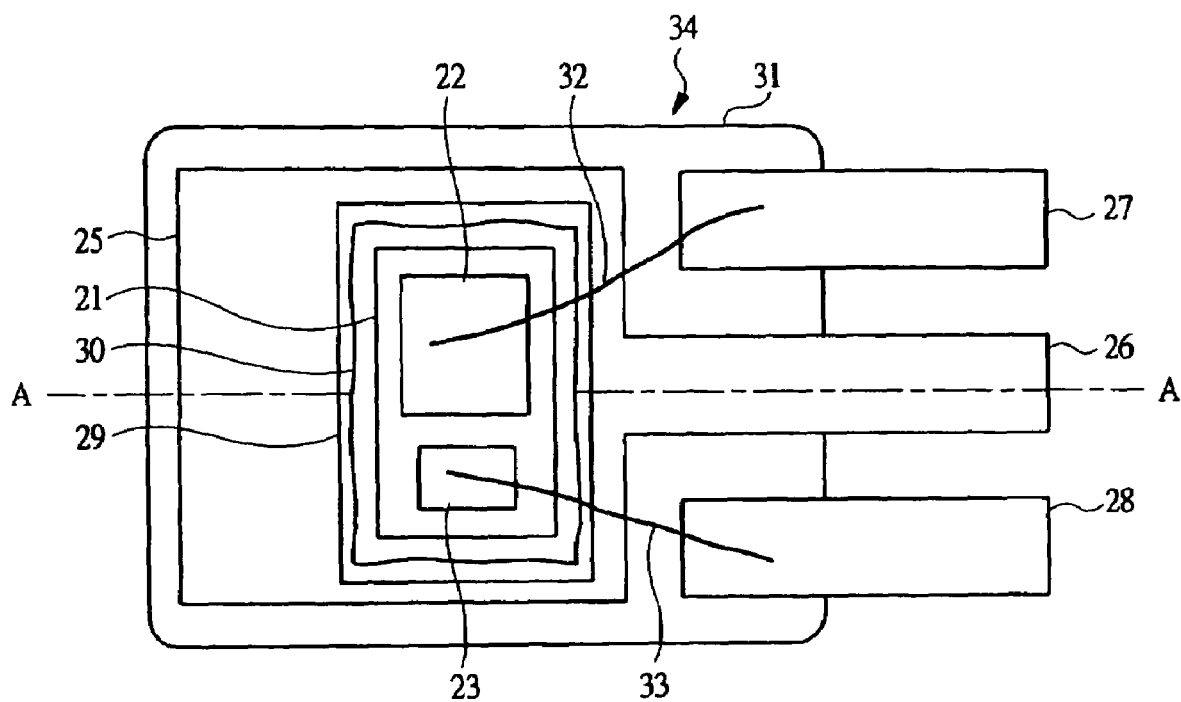
FIG. 6 is a plan view showing an internal structure of a transistor as a modification of the semiconductor apparatus according to the embodiment of the present invention, with an encapsulant regarded as transparent.
Figure 7:
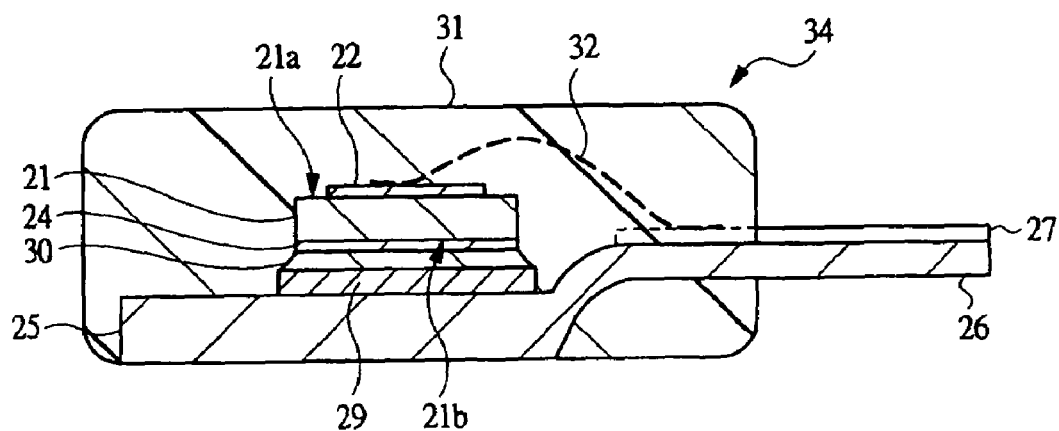
FIG. 7 is a sectional view showing a sectional structure taken on line A-A in FIG. 6.
Figure 8:
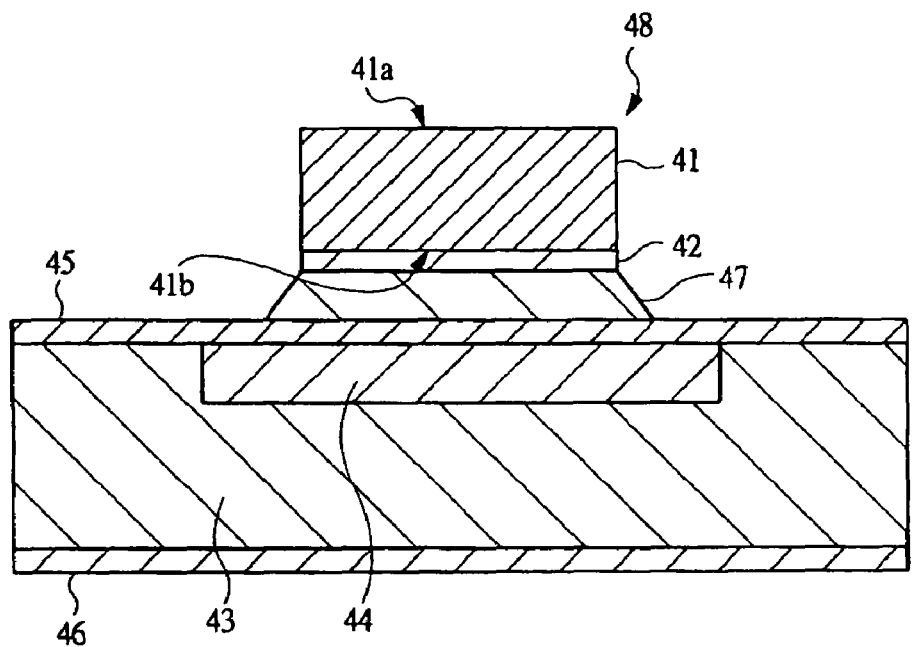
FIG. 8 is a partial sectional view showing a structure of a semiconductor apparatus according to a modification of the embodiment of the present invention.
Figure 9:
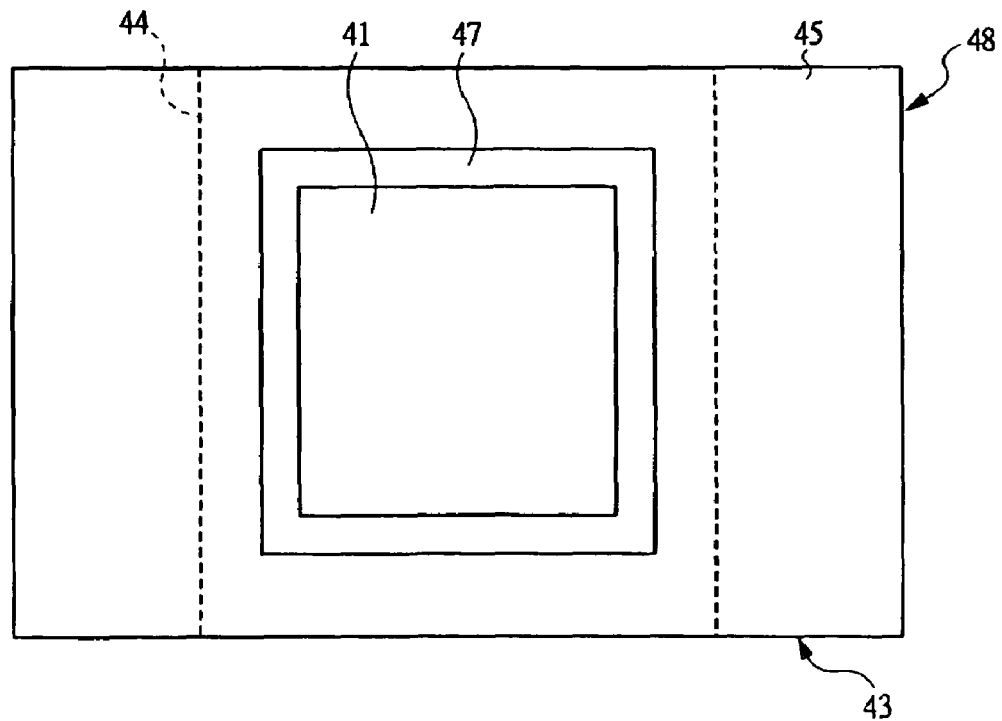
FIG. 9 is a plan view showing the structure of the semiconductor apparatus shown in FIG. 8.
Figure 10:
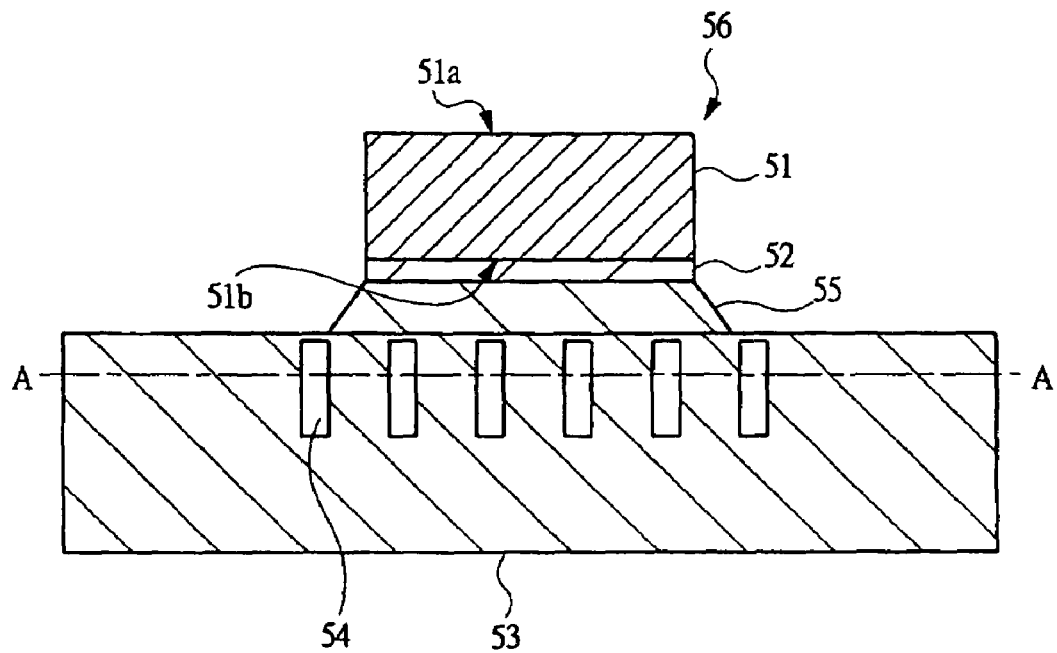
FIG. 10 is a partial sectional view showing a structure of a semiconductor apparatus according to a modification of the embodiment of the present invention.
Figure 11:
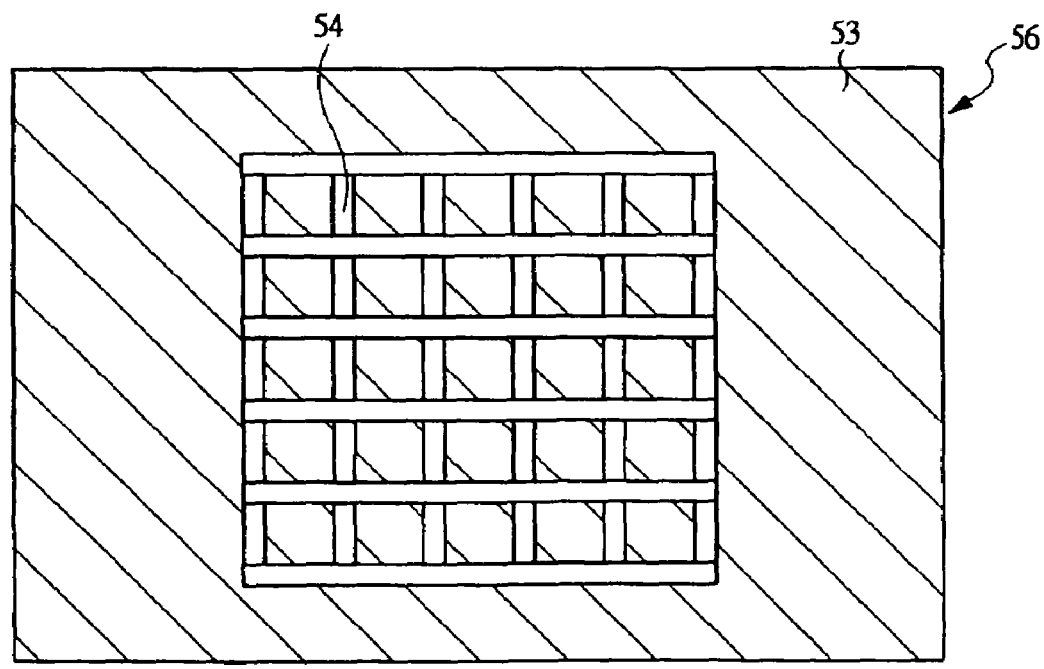
FIG. 11 is a sectional view showing a sectional structure taken on line A-A in FIG. 10.
Figure 12:
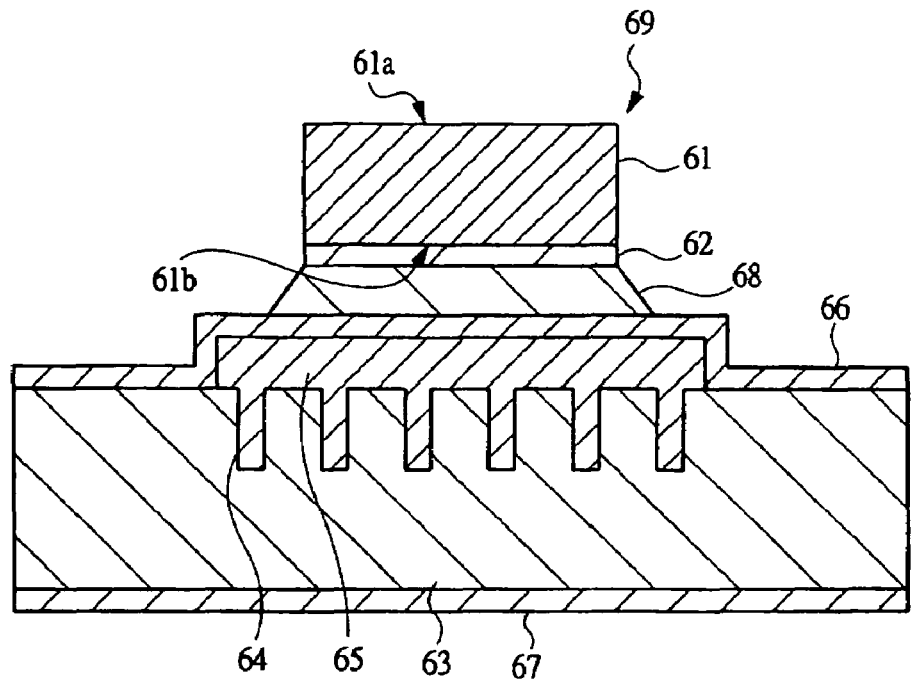
FIG. 12 is a partial sectional view showing a structure of a semiconductor apparatus according to a modification of the embodiment of the present invention.
Figure 13:
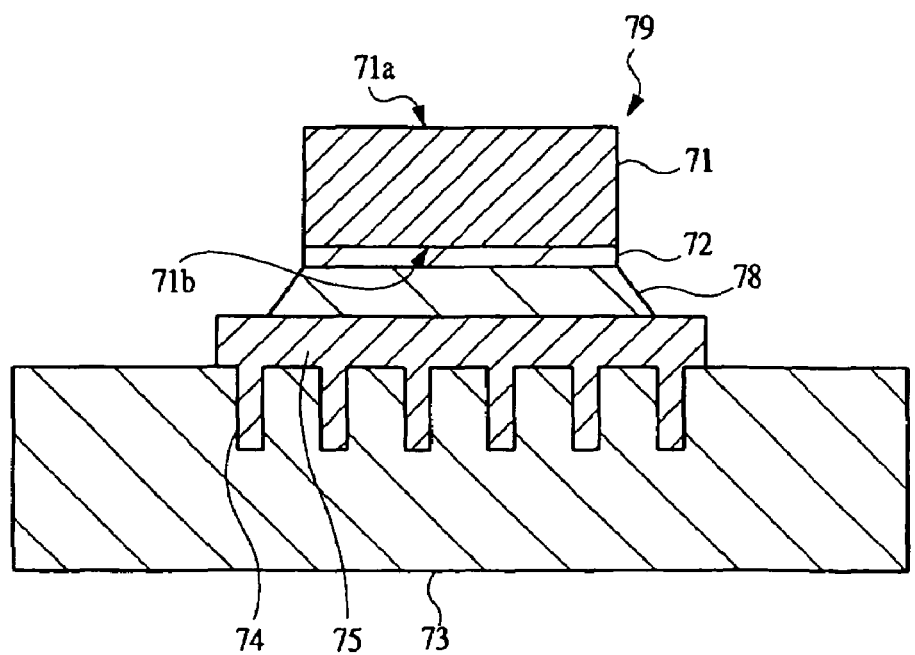
FIG. 13 is a partial sectional view showing a structure of a semiconductor apparatus according to a modification of the embodiment of the present invention.
Figures 14, 15:
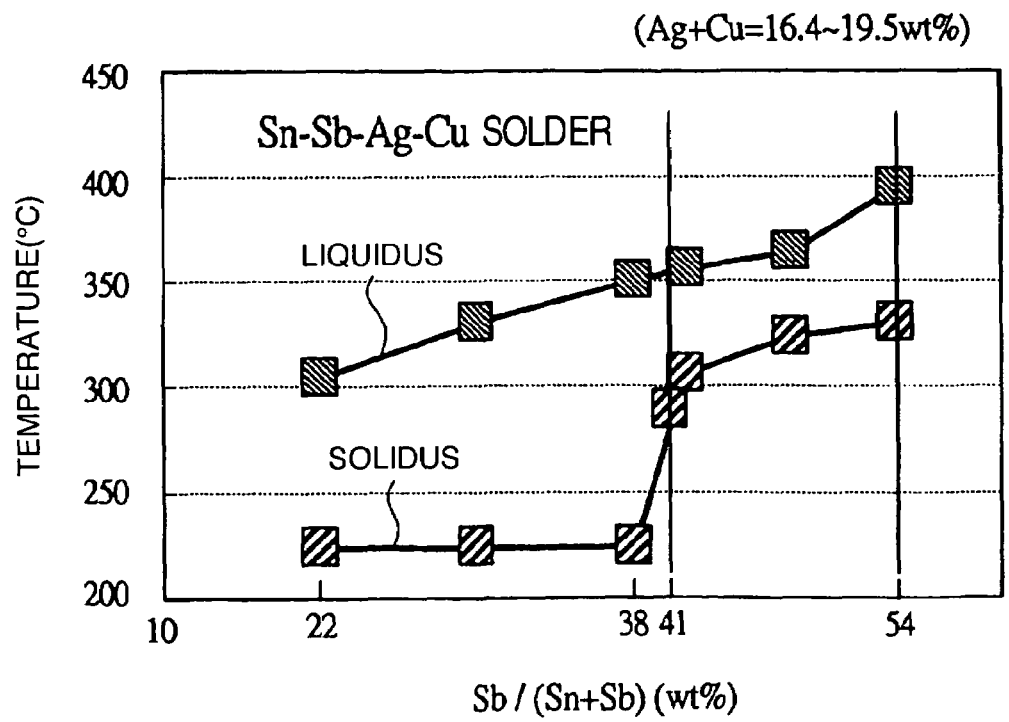
FIG. 14 is a data table showing an example of evaluation results of solidus and liquidus temperatures of Bi—Ag—Sb based alloys used in the semiconductor apparatus according to the embodiment of the present invention.
FIG. 15 is a result graph showing an example of evaluation results of solidus and liquidus temperatures of Sn—Sb—Ag—Cu based alloys used in the semiconductor apparatus according to the embodiment of the present invention.
Figure 16:
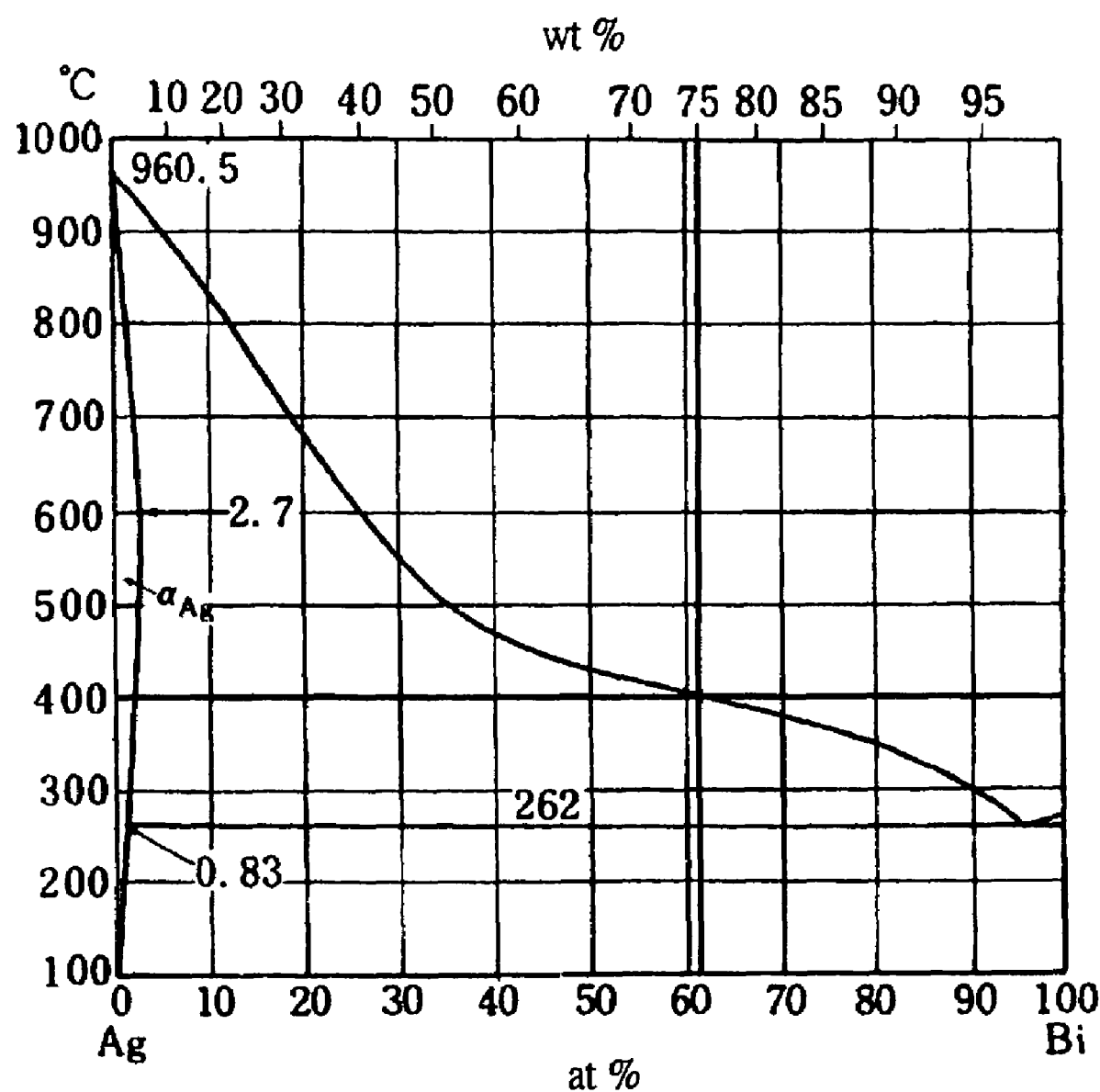
FIG. 16 is a state graph showing an example of a two-dimensional state graph of Bi—Ag based alloys used in the semiconductor apparatus according to the embodiment of the present invention.
Figure 17:
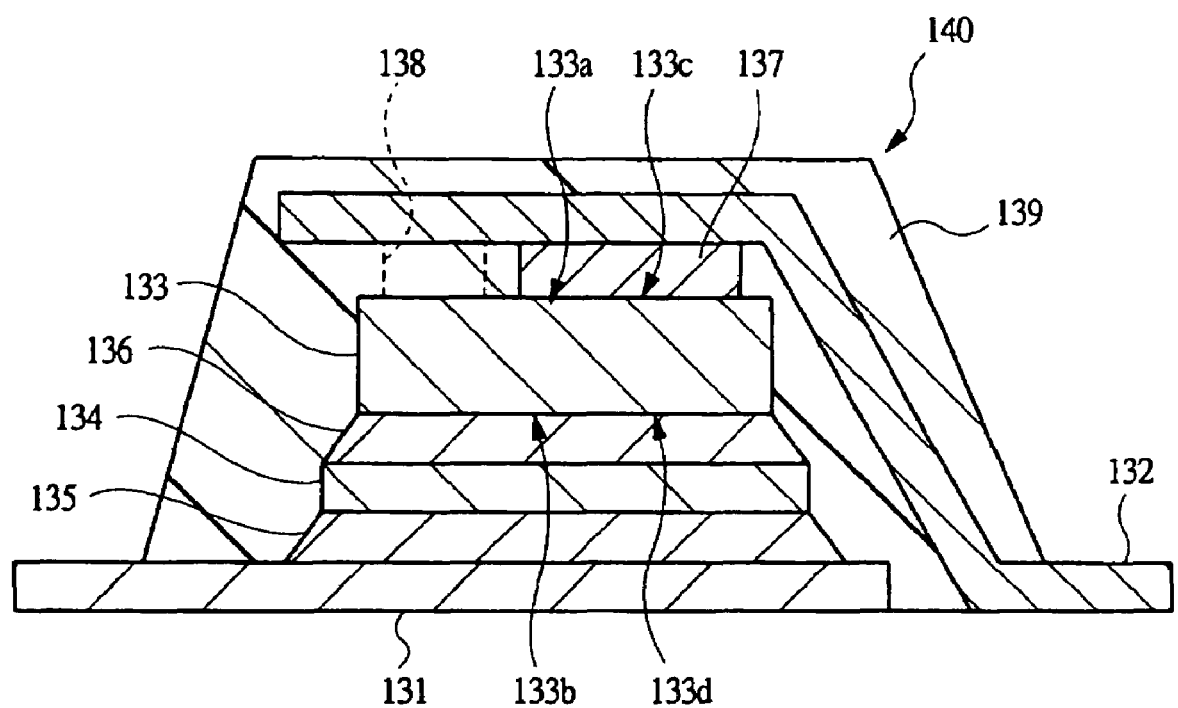
FIG. 17 is a sectional view showing a structure of a transistor as a modification of the semiconductor apparatus according to the embodiment of the present invention.
Figure 18:
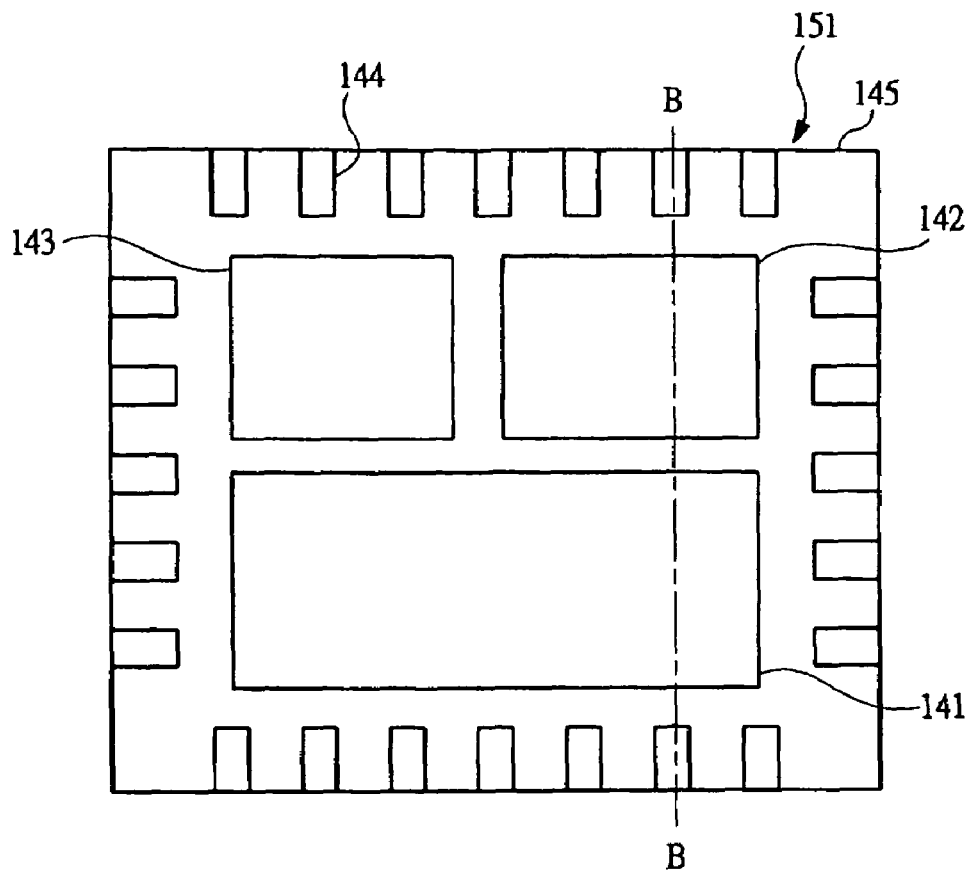
FIG. 18 is a back view showing the back-side structure of a semiconductor apparatus according to a modification of the embodiment of the present invention.
Figure 19:
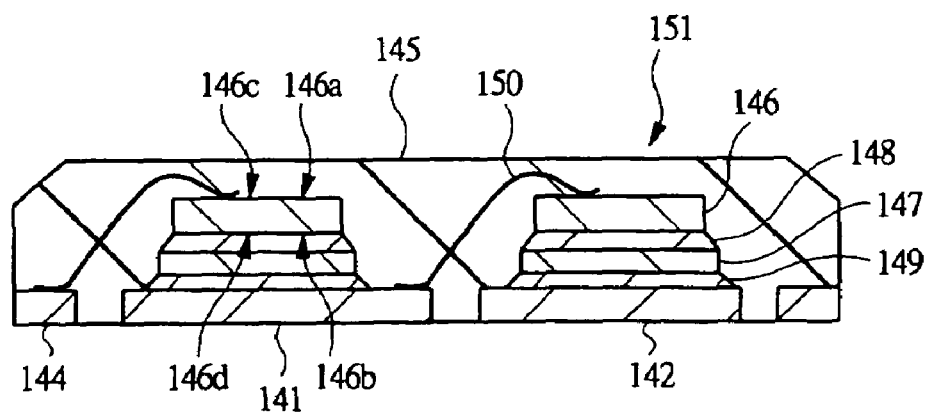
FIG. 19 is a sectional view showing a sectional structure taken on line B-B in FIG. 18.

FIG. 1 is a plan view showing an example of an internal structure of a semiconductor apparatus according to an embodiment of the present invention with an encapsulant regarded as transparent; FIG. 2 is a sectional view showing the section taken on line A-A in FIG. 1; FIG. 3A is a partial plan view showing an example of the structure of a lead frame used for assembling the semiconductor apparatus according to the embodiment of the present invention; FIG. 3B is a partial sectional view showing a section of the same taken on line A-A in FIG. 3A; FIG. 4 is a manufacturing process flow chart showing an example of an assembling procedure of the semiconductor apparatus according to the embodiment of the present invention; FIG. 5 is a result data table showing an example of evaluation results of the semiconductor apparatus according to the embodiment of the present invention, in which a thermal stress reduction plate and solder incorporated in the semiconductor apparatus were set as parameters; FIG. 6 is a plan view showing an internal structure of a transistor as a modification of the semiconductor apparatus according to the embodiment of the present invention, with an encapsulant regarded as transparent; FIG. 7 is a sectional view showing a section taken on line A-A in FIG. 6; FIG. 8 is a partial sectional view showing a structure of a semiconductor apparatus according to a modification; FIG. 9 is a plan view showing the structure of the semiconductor apparatus shown in FIG. 8; FIG. 10 is a partial sectional view showing a structure of a semiconductor apparatus according to a modification; FIG. 11 is a sectional view showing a section taken on line A-A in FIG. 10; FIG. 12 is a partial sectional view showing a structure of a semiconductor apparatus according to a modification; FIG. 13 is a partial sectional view showing a structure of a semiconductor apparatus according to a modification; FIG. 14 is a data table showing an example of evaluation results of solidus and liquidus temperatures of Bi—Ag—Sb based alloys; FIG. 15 is a result graph showing an example of evaluation results of solidus and liquidus temperatures of Sn—Sb—Ag—Cu based alloys; FIG. 16 is a state graph showing an example of a two-dimensional state graph of Bi—Ag based alloys; FIG. 17 is a sectional view showing a structure of a transistor as a modification of the semiconductor apparatus according to the embodiment; FIG. 18 is a back view showing the back-side structure of a semiconductor apparatus according to a modification of the embodiment; and FIG. 19 is a sectional view showing a section taken on line B-B in FIG. 18.

The semiconductor apparatus according to this embodiment shown in FIGS. 1 and 2 is an electric power semiconductor package 14 having a vertical semiconductor device. For example, the semiconductor apparatus is a transistor package in which a circuit of a transistor device has been formed on a main surface 1$a$ of the semiconductor device.

Description will be made about the configuration of the power semiconductor package 14. The power semiconductor package 14 is constituted by a semiconductor chip 1 serving as a semiconductor device and having a main surface 1$a$, a back surface 1$b$ opposite to the main surface 1$a$, a main electrode 2 and a control electrode 3 formed in the main surface 1$a$, an electrode 15 formed in the back surface 1$b$, and a circuit formed in the main surface 1a; a conductive die pad 4 joined to the electrode 15 of the back surface 1b of the semiconductor chip 1; a first lead 6 electrically connected with the main electrode 2 of the main surface 1a of the semiconductor chip 1; a second lead 7 electrically connected with the control electrode 3 of the main surface 1a of the semiconductor chip 1; a third lead 5 linked integrally with the die pad 4; an Al wire 12 for electrically connecting the main electrode 2 with the first lead 6; an Al wire 13 for electrically connecting the control electrode 3 with the second lead 7; a thermal stress reduction plate (means for reducing thermal stress) 8 disposed between the semiconductor chip 1 and the die pad 4 and having lower thermal expansion and lower yield stress or lower elastic modulus than a Cu alloy which is a chief material forming the die pad 4; and an encapsilant 11 for encapsulating the semiconductor chip 1, the Al wires 12 and 13, the die pad 4 and a part of each lead with encapsulating resin.

Further, the semiconductor chip 1 and the thermal stress reduction plate 8 are joined to the thermal stress reduction plate 8 and the die pad 4 respectively through joint materials 9 and 10 made of either an alloy (solder containing no lead, which will be also referred to as Pb free solder hereinafter) having Sn—Sb—Ag—Cu as its primary constituent elements or an alloy (Pb free solder) having Bi—Ag—Sb as its primary constituent elements, where the solidus temperature is not lower than 270° C. and the liquidus temperature is not higher than 400° C.

For example, as shown in FIG. 1, the semiconductor chip 1 serving as a vertical semiconductor device and made of silicon (Si) is die-bonded to the die pad 4 of Cu through the thermal stress reduction plate 8 by the joining materials 9 and 10. The thermal stress reduction plate 8 is made of a Cu/Fe—Ni alloy/Cu laminate and having a coefficient of thermal expansion of 8-12 ppm.

Ti/Ni/Au or Ag, V, or Ta/Ni/Au or Ag is formed in the surface layer of the back surface 1b of the semiconductor chip 1. When the Sn—Sb—Ag—Cu alloy is used as the joining materials 9 and 10, electrolytic Ni plating or electroless NiP plating is performed on the surface and back surface of the thermal stress reduction plate 8 while the surface of the die pad 4 is formed as electrolytic Ni plating or non-plated Cu.

On the other hand, when the Bi—Ag—Sb alloy is used as the joining materials 9 and 10, electrolytic Ag plating is performed on the surface and back surface of the thermal stress reduction plate 8 while the surface of the die pad 4 is formed as electrolytic Ag plating or non-plated Cu.

The main electrode 2 and the control electrode 3 of the main surface 1a of the semiconductor chip 1 are connected to the first lead 6 and the second lead 7 for external extraction respectively by the Al wires 12 and 13. Further, the encapsulant 11 made of encapsulating resin is formed to cover the semiconductor chip 1, the Al wires 12 and 13, the thermal stress reduction plate 8 and the joining materials 9 and 10 wholly, and the die pad 4, the first lead 6, the second lead 7 and the third lead 5 partially.

The power semiconductor package 14 shown in FIGS. 1 and 2 is designed to have a structure as follows. That is, the semiconductor chip 1 having a coefficient Si of thermal expansion and the thermal stress reduction plate 8 serving as a member having a low coefficient of thermal expansion between that of the semiconductor chip 1 and that of the die pad 4 made of a Cu alloy are disposed in a region of the die pad 4 where a device will be mounted. The semiconductor chip 1 and the die pad 4 are joined by an alloy containing Sn—Sb—Ag—Cu as its primary constituent elements or an alloy containing Bi—Ag—Sb as its primary constituent elements.

The thermal stress reduction plate 8 serving as a low thermal expansion member may be disposed on the die pad 4 made of the Cu alloy. In such a case, when a Cu/FeNi composite material or a Cu/Cu20 composite material having a coefficient of thermal expansion of 8-12 ppm/k is used as the low thermal expansion member, the difference in thermal expansion can be reduced to about ½ as compared with the case where a Cu alloy is joined directly to the Si semiconductor chip 1. It is therefore possible to prevent the semiconductor chip 1 from cracking during assembly or temperature cycles.

The thermal stress reduction plate 8 serving as means for reducing thermal stress is a sheet-like member formed to be larger than the semiconductor chip 1 and smaller than the die pad 4 as to length and width in a plane, as shown in FIG. 1. Since the thermal stress reduction plate 8 is larger than the semiconductor chip 1, heat generated from the chip can leave the back surface 1b of the chip for the outside directly without passing through the inside of the chip, and reach the die pad 4 through the joint material 10 or the thermal stress reduction plate 8. Accordingly, since the heat does not pass through the inside of the chip, there is no fear that a local temperature rise occurs in the inside of the chip at the time of heat radiation. Thus, the cell device inside the chip can be prevented from being broken due to the temperature rise.

Since the thermal stress reduction plate 8 is larger than the semiconductor chip 1, the joint material 10 under the chip protrudes outside from the circumference of the semiconductor chip 1. Accordingly, at the time of inspection after assembly, visual check for checking whether solder connection has been performed surely or not can be performed easily.

Next, the joining materials 9 and 10 are made of an alloy containing Sn—Sb—Ag—Cu as their chief components, and the composition of the alloy is set as 43 wt %$\leq$Sb/(Sn+Sb)$\leq$48 wt % and 15 wt %$\leq$(Ag+Cu)$\leq$25 wt %. In this manner, as shown in FIG. 15, the melting properties of the alloy can be set as a solidus temperature of not lower than 270° C. and a liquidus temperature of not higher than 380° C. Thus, die bonding can be performed at 400° C. or lower. In addition, the solder strength reaches 100 MPa or higher. Accordingly, the degree of deformation of the solder portion is reduced due to combination with the thermal stress reduction structure. Thus, the temperature cycle life of the solder portion can be improved on a large scale as compared with the case of a background-art Pb solder.

Since the solidus temperature is not lower than 270° C., there is no fear that the joining materials are melt again even by heating at 260° C. during assembly. Thus, satisfactory tolerance to reflow at 260° C. can be obtained.

On the other hand, when the joining materials 9 and 10 are made of a Bi—Ag—Sb alloy, and the composition of the alloy is set as 5 wt %$\leq$Ag/(Bi+Ag)$\leq$25 wt % and 5 wt %$\leq$Sb$\leq$20 wt %, the solidus temperature can be made not lower than 270° C. and the liquidus temperature can be made not higher than 390° C. Thus, die bonding can be performed at 400° C. or lower.

The value 5 wt %$\leq$Ag/(Bi+Ag) is selected based on conditions necessary to improve the mechanical properties about the elongation of the solder. The value Ag/(Bi+Ag)$\leq$25 wt % is selected based on a composition range necessary to make the liquidus temperature not higher than 400° C. as shown in FIG. 16. The value 5 wt %$\leq$Sb is selected based on the solidus temperature 270° C. based on which the alloy is tolerable to reflow at 260° C. The value Sb$\leq$20 wt % is selected based on the condition that the liquidus temperature must be not higher than 400° C.

The solder strength of this solder reaches 100 MPa or higher when Sb is added to the solder. The temperature cycle life of the solder can be improved on a large scale due to combination with the thermal stress reduction mechanism, as compared with the case of background-art solder containing Pb. Since the solidus temperature is not lower than 270° C., there is no fear that the solder is melt again during reflow at 260° C. Thus, the solder can endure a repetitive reflow test.

In the power semiconductor package 14 according to this embodiment, a Pb free solder material made of an Sn—Sb—Ag—Cu alloy or a Bi—Ag—Sb alloy is used as the joining materials. Accordingly, it is possible to provide a transistor package product having a low load on environment. Due to the high strength and high hardness properties of the joining materials, thermal stress mostly assigned to the joining materials in the background art can be diffused to the semiconductor chip 1 or the die pad 4. At the same time, due to the thermal stress reduction plate 8 put between the semiconductor chip 1 and the die pad 4 and made of a low thermal expansion material of Cu/Fe—Ni/Cu, the thermal stress applied to the semiconductor chip 1 can be reduced so that the chip can be prevented from cracking. Further, together with these advantages, the thermal fatigue lives of the joining materials 9 and 10 can be elongated on a large scale. Thus, a high reliability transistor package (power semiconductor package 14) can be provided without lowering the productivity.

When die bonding is performed using an Sn—Sb—Ag—Cu alloy or a Bi—Ag—Sb alloy with a solidus temperature not lower than 270° C. and a liquidus temperature not higher than 400° C., it is possible to provide a Pb free solder transistor package (power semiconductor package 14) tolerable to a step of reflow at 260° C. for secondary assembly, and excellent in temperature cycle life and high temperature reliability.

Next, assembly of the power semiconductor package 14 will be described with reference to FIGS. 3A, 3B and 4.

First, description will be made about the summary of the assembly. In a reducing atmosphere containing hydrogen, a lead frame 100 shown in FIGS. 3A and 3B is heated to 360° C. Sn—Sb—Ag—Cu alloy particles or Bi—Ag—Sb alloy particles having a predetermined size are supplied onto a die pad 101 and melted. Further, a thermal stress reduction plate 109 serving as means for reducing thermal stress is mounted with scrub added thereto. After that, with this heating state kept as it is, the same alloy particles are supplied onto the thermal stress reduction plate 109 and melted. A semiconductor chip 117 is mounted with scrub added thereto. Thus, die bonding is performed.

After the lead frame 100 is then cooled down, leads 102 serving as external connection terminals are connected with chip electrodes by Al wire bonding, and resin molding is performed using a molding die. After that, unnecessary lead frame portions are cut and removed. Thus, the package is completed. In the assembly according to this embodiment, the step of joining the thermal stress reduction plate 109 is added as compared with the background-art process for assembling a transistor package having no thermal stress reduction plate 109. However, the assembling method is the same as a chip joining process. Therefore, the manufacturing throughput is equal to that in the background art.

Successively, detailed assembly of a power semiconductor package 126 as an example of the semiconductor apparatus according to this embodiment will be described with reference to the manufacturing process flow chart shown in FIG. 4.

First, a multiple lead frame 100 having die pads 101 and a plurality of leads 102 disposed around each die pad 101 and serving as external connection terminals as shown in FIG. 3 is prepared. In the lead frame 100, a plurality of die pads 101 and a plurality of leads 102 are fixed to a frame portion 105 through suspending leads 103 and 104 respectively. The lead frame 100 is, for example, a sheet-like member formed out of a Cu alloy as its chief material.

After that, in a solder supply process shown in Step S1, paste or granular Pb free solder is supplied onto the die pads 101 of the lead frame 100 and melted. Here, the lead frame 100 is preheated in a reducing atmosphere. A predetermined amount of solder paste 107 is, for example, supplied onto the die pads 101 by a dispenser 106. The solder is melted by main heating with a heat block. Thus, molten solder 108 is formed.

The Pb free solder is made of either an alloy solder material having Sn—Sb—Ag—Cu as its main constituent elements or an alloy solder material having Bi—Ag—Sb as its main constituent elements, in which the solidus temperature is not lower than 270° C. and the liquidus temperature is not higher than 400° C.

After that, in a process for supplying a thermal stress reduction plate and performing scrub bonding as shown in Step S2, a thermal stress reduction plate 109 lower in thermal expansion, lower in yield stress and lower in elastic modulus than the Cu alloy is disposed on the Pb free solder. After that, the thermal stress reduction plate 109 is pressurized and scrubbed. Thus, the thermal stress reduction plate 109 is joined and fixed. Here, the thermal stress reduction plate 109 is held on the molten solder 108 by a collet 110 while suction 111 is performed. After the thermal stress reduction plate 109 is further supplied onto the molten solder 108, scrub 112 is concurrently applied to stretch the solder so that the solder is as large as the thermal stress reduction plate 109. Thus, solder joint 113 of the thermal stress reduction plate 109 is achieved.

After that, in a process for supplying solder as shown in Step S3, paste or granular Pb free solder similar to the aforementioned solder is supplied onto the thermal stress reduction plate 109 and melted. Here, a predetermined amount of solder paste 115 in a heated state is supplied onto the thermal stress reduction plate 109 by a dispenser 114. Thus, the solder is melted to form molten solder 116.

After that, in a process for supplying a chip and performing scrub bonding as shown in Step S4, a semiconductor chip 117 is disposed on the molten solder 116, and the semiconductor chip 117 is then pressurized and scrubbed. Thus, the semiconductor chip 117 is joined and fixed. Here, the semiconductor chip 117 is supplied onto the molten solder 116 by a collet 118, and scrubbing 119 is applied to push the semiconductor chip 117. Thus, die bonding is performed. Further, the semiconductor chip 117 is cooled to a predetermined temperature in a reducing atmosphere. As a result, solder junction 120 is obtained between a back surface 117b of the semiconductor chip 117 and the solder. The semiconductor 117 is joined with its main surface 117a turned up.

After that, in a wire bonding process shown in Step S5, chip electrodes are electrically connected to the leads 102 of the lead frame 100. Here, after cooled to the room temperature, the electrodes on the chip and the leads 102 are electrically connected by ultrasonic bonding of Al wires 121 and 122 in the atmosphere. Here, ultrasonic vibration 124 is applied by a bonding tool 123 so as to perform the ultrasonic bonding.

After that, in a molding process shown in Step S6, resin molding is performed using encapsulating resin so as to cover the semiconductor chip 117, the die pad 101 and parts of the leads 102. Thus, an encapsulant 125 is formed. Here, each package is covered with the encapsulating resin individually by transfer molding using a mold tool, and baked. Thus, the encapsulant 125 is formed.

After that, in a cutting and shaping process shown in Step S7, each lead 102 protruding from the encapsulant 125 is cut and separated from the lead frame 100, while the lead 102 is shaped into a desired shape by bending. Here, each lead 102 is cut and shaped, and each suspending lead 103, 104 is cut. Thus, assembly is completed (completion shown in Step S8).

All the die bonding processes in Steps S1-S4 are a series of processes which are performed under the reducing atmosphere and in which the lead frame 100 heated is conveyed by a conveyor. Organic components of the solder pastes 107 and 115 are solvents characterized in that the solvents are evaporated perfectly by heating and disappear before the solder is melted.

In the assembly of the semiconductor apparatus according to this embodiment, the scrubbing 119 is applied to bond the thermal stress reduction plate 109 with the semiconductor chip 117. Accordingly, the thermal stress reduction plate 109 can be joined to the semiconductor chip 117 in the state where voids in the solder have been reduced on a large scale. Thus, a semiconductor apparatus having a stable heat radiation property can be provided. Since high-temperature Pb free solder is supplied in the form of paste, the solder can be supplied continuously and automatically easily. Even if the usage of the solder changes due to a change of the chip size, adjustment can be made without changing any equipment. Thus, a manufacturing process superior in mass productivity can be provided. Further, the process is similar to a background-art assembling process using high Pb solder. Accordingly, background-art assembling equipment can be used directly, so that increase of equipment cost can be suppressed to be low.

Next, FIG. 5 shows results of various evaluations upon semiconductor apparatus assembled changing the composition of the joint material and the thermal stress reduction plate. In FIG. 5, No. 1 to No. 15 show results of examples of this embodiment, and No. 16 to No. 25 show results of comparative examples. In Examples No. 1 to No. 4 of this embodiment, a low thermal expansion plate 0.2 mm thick with Cu/Fe—Ni alloy/Cu laminated at a thickness ratio of 1:1:1 is used as the thermal stress reduction plate, and the solder composition satisfies the conditions of 43 wt %≦Sb/(Sn+Sb) ≦48 wt % and 15 wt %≦(Ag+Cu)≦25 wt %. Each example can clear criteria all over the evaluation items of joining temperature (OK if it is not higher than 400° C.), chip cracking, tolerance to reflow at 260° C., and temperature cycle life. When the Sb content is large, a high joining temperature is required as in Comparative Examples No. 16 and No. 18. Since the solder is solidified at a high temperature range, thermal stress increases so that there occurs a chip crack. When the solder is formed as a three-element based alloy where Cu is excluded and only Ag is used as in Comparative Example No. 17, only the liquidus temperature increases so that the joining temperature increases but the solidus temperature does not rise. It is therefore impossible to obtain the tolerance to reflow at 260° C.

Even if the joint material according to the present invention was used, absence of the thermal stress reduction plate 8 led to a chip crack. When a thermal stress reduction plate 8 having a coefficient of thermal expansion not higher than 6.7 ppm/k was used, high thermal stress occurred between the die pad 4 and the thermal stress reduction plate 8, so that there occurred a phenomenon that Ni plating of the die pad 4 exfoliated from its substrate.

From these results, it can be determined that it is appropriate to put the coefficient of thermal expansion of the thermal stress reduction plate 8 in an intermediate region between that of the die pad 4 and that of the semiconductor chip 1.

Examples No. 8 to No. 12 show evaluation results where alloys in which Sb was added to Bi—Ag was used as joint materials and packages were assembled using the joining materials. If the alloy compositions of the joining materials 9 and 10 are set to satisfy 5 wt %≦Ag/(Bi+Ag)≦25 wt % and 5 wt %≦Sb≦20 wt %, those examples can clear the criteria all over the evaluation items when the thermal stress reduction plate 8 is used.

However, when the Sb content is low as in Comparative Examples No. 21 and No. 23, the solidus temperature is 262° C., that is too low to endure a 260° C. reflow test. When the Sb content is high as in Comparative Example No. 25, the solidus and liquidus temperatures increase so that a joining temperature not lower than 400° C. is required. The hardness also increases so that there occurs a chip crack.

In such a manner, when a thermal stress reduction plate 8 whose coefficient of thermal expansion is a value (8-12 ppm/k) between that of the semiconductor chip 1 and that of the die pad 4 is applied and an Sn—Sb—Ag—Cu alloy or a Bi—Ag—Sb alloy is used as the joining materials 9 and 10, it is possible to provide a transistor package product (power semiconductor package 126) using a Pb free solder and having desired reliability.

FIGS. 6 and 7 show a power semiconductor package (semiconductor apparatus) 34 according to a modification of this embodiment. A soft means for reducing thermal stress, which is lower in yield stress or proof stress than a Cu alloy is disposed with a predetermined thickness on a device mounting region of a die pad 25 made of the Cu alloy. Ag which is soft in terms of quality of material is selected for the means for reducing thermal stress. An Ag plated layer 29 having a thickness of 20 μmt is disposed on the die pad 25 made of the Cu alloy, in advance.

A semiconductor chip 21 having an electrode 24 on its back surface 21b whose surface layer is made of Ti/NiP/Ag, Ti/Ni/Ag or Ti/Ni/Cu/Ag is die-bonded onto the Ag plated layer 29 by a Bi—Ag—Sb alloy 30. A main electrode 22 and a control electrode 23 of a main surface 21a of the semiconductor chip 21 are connected to a first lead 27 and a second lead 28 through bonded Al wires 32 and 33 respectively. A third lead 26 is linked integrally with the die pad 25.

An encapsulant 31 is formed to cover the semiconductor chip 21, the Al wires 32 and 33 and the Bi—Ag—Sb alloy 30 wholly, and the die pad 25, the first lead 27, the third lead 26 and the second lead 28 partially.

According to this embodiment, the soft Ag plated layer 29 is formed to be thick on the die pad 25 made of the Cu alloy, and the semiconductor chip 21 is die-bonded thereon. The soft Ag plated layer 29 low in yield strength or proof strength is applied onto the die pad 25 made of the Cu alloy. Due to this structure, the soft Ag plated layer 29 put in low stress condition is plastically deformed to absorb thermal strain generated between the die pad 25 made of the Cu alloy and the semiconductor chip 21 made of Si. Accordingly, there is no case that high stress occurs in the semiconductor chip 21. As a result, it is possible to solve the problem that the semiconductor chip 21 is cracked in a cooling process after die bonding, in an assembling process or in a heating/cooling process during application of a temperature cycle.

Thermal strain generated between the die pad 25 and the semiconductor chip 21 is absorbed by the plastic deformation of the Ag plated layer 29 so that high stress is not applied to the semiconductor chip 21. Accordingly, there occurs no chip crack. In addition thereto, since the Bi—Ag—Sb alloy 30 is used as a joint material, it is possible to provide a transistor package product (power semiconductor package 34) having a low load on environment. Further, since the Ag plated layer 29 is formed on the die pad 25 in advance, the transistor package (power semiconductor package 34) can be assembled in quite the same method as that in the background art. It is therefore possible to make the semiconductor apparatus (product) free from Pb without investing any special equipment.

Next, FIGS. 8 and 9 show a power semiconductor package 48 which is a semiconductor apparatus according to a modification. In the power semiconductor package 48, a low thermal expansion member (means for reducing thermal stress) 44 made of an Fe—Ni alloy or an Fe—Ni—Co alloy is buried in a chip mounting surface of a die pad 43 made of a Cu alloy by rolling. An Ni plated layer 45 is applied onto the low thermal expansion member 44. A semiconductor chip 41 having an electrode 42 on its back surface 41b is die-bonded to the position where the low thermal expansion member 44 is buried, by a joint material 47 made of an Sn—Sb—Ag—Cu alloy, in the state where the main surface 41a of the semiconductor chip 41 is turned up. An Ni plated layer 46 is also formed on the opposite surface of the die pad 43 to the surface where the Ni plated layer 45 is formed.

In the power semiconductor package 48 according to the modification, the low thermal expansion member 44 which is a means for reducing thermal stress is buried in the die pad 43 in advance, and the Ni plated layer 45 is formed on the surface of the low thermal expansion member 44. Accordingly, the power semiconductor package 48 can be assembled in the same assembling process as that of the background-art semiconductor apparatus. Further, a semiconductor apparatus using Pb free solder can be assembled in background-art equipment. In addition, the man-hour for assembling is equal to that for assembling in the background art. Thus, it is possible to provide a power semiconductor package 48 superior in productivity.

Next, a power semiconductor package 56 which is a semiconductor apparatus according to a modification shown in FIGS. 10 and 11 has a structure to relax thermal strain. Press working or press working and cut working are performed a plurality of times upon an underneath portion (inside portion) of a device mounting region of a die pad 53 made of a Cu alloy, so that a plurality of internally built fine void portions (means for reducing thermal stress) 54 are formed. The area where the void portions 54 are formed is larger than the chip size, and the depth of each void portion 54 is about 0.2-0.4 mm. A Cu alloy portion between adjacent ones of the void portions 54 is formed to be about 0.2-0.5 mm thick. The void portions 54 are formed in the following manner. First, slits having openings are formed by press working or the like. After that, the openings are crushed and closed by second press working. Thus, the internally built void portions 54 can be formed.

The void portions 54 are formed like a grid as shown in FIG. 11. A semiconductor chip 51 with its main surface 51a turned up is die-bonded onto the die pad 53 of the Cu alloy above the void portions 54 formed like a grid, by a joint material 55 of an Sn—Sb—Ag—Cu alloy or a Bi—Ag—Sb alloy. That is, an electrode 52 of a back surface 51b of the semiconductor chip 51 is joined to the joint material 55.

In the power semiconductor package 56 according to the modification, the internally built void portions 54 are formed in the underneath portion of the device mounting region of the die pad 53 so that thermal strain between the semiconductor chip 51 and the die pad 53 can be absorbed by the void portions 54 with the result that high thermal stress can be prevented from occurring in the semiconductor chip 51. Thus, chip cracking can be prevented. In addition, since no special material is added to a lead frame member provided with the die pad 53, the cost of the lead frame member can be suppressed to be low. Thus, a transistor package (power semiconductor package 56) using Pb free solder can be obtained at a low cost.

Power semiconductor packages 69 and 79 are semiconductor apparatus shown in FIGS. 12 and 13 respectively. In each power semiconductor package 69, 79, groove portions 64, 74 which are open means for reducing thermal stress are formed in a device mounting region of a die pad 63, 73 to be mounted with a semiconductor chip 61, 71, and an Ag plated layer 65, 75 is formed to fill the groove portions 64, 74 and to be about 10 μmt thick on the device mounting region of the die pad 63, 73.

The power semiconductor package 69 shown in FIG. 12 uses an Sn—Sb—Ag—Cu alloy as a joint material 68. In this case, an Ni plated layer 66 is applied to the surface of the die pad 63 where the Ag plated layer 65 is formed, and an Ni plated layer 67 is applied to the opposite surface of the die pad 63. Between Ag based solder and Sn based solder, Ag may be melted into the Sn based solder so as to change the melting point of the Sn based solder. In order to prevent this, the Ni plated layers 66 and 67 are formed.

Accordingly, in the power semiconductor package 69, the semiconductor chip 61 with its main surface 61a turned up is die-bonded onto the Ag plated layer 65 on the die pad 63 of the Cu alloy through the Ni plated layer 66 by the joint material 68 of an Sn—Sb—Ag—Cu alloy. That is, an electrode 62 of a back surface 61b of the semiconductor chip 61 is joined to the joint material 68.

On the other hand, the power semiconductor package 79 shown in FIG. 13 uses a Bi—Ag—Sb alloy as a joint material 78. In this case, a semiconductor chip 71 is die-bonded directly onto a die pad 73 of a Cu alloy. This reason is as follows. Reaction between Ni and the Bi—Ag—Sb alloy is so violent that the characteristic of the Bi—Ag—Sb alloy is changed. In order to prevent this, the joint material 78 of the Bi—Ag—Sb alloy is therefore disposed directly on an Ag plated layer 75 without putting any Ni based plated layer therebetween, so as to join and fix the semiconductor chip 71.

Accordingly, in the power semiconductor package 79, the semiconductor chip 71 with the main surface 71a turned up is die-bonded directly onto the Ag plated layer 75 on the die pad 73 of the Cu alloy by the joint material 78 of the Bi—Ag—Sb alloy. That is, an electrode 72 of a back surface 71b of the semiconductor chip 71 is joined to the joint material 78.

In the power semiconductor package 69, 79 according to each modification, the soft Ag plated layer 65, 75 is applied to the open groove portions 65, 74 which are provided in the die pad 63, 73. Accordingly, the power semiconductor package 69, 79 has a structure capable of absorbing a large thermal strain between the semiconductor chip 61, 71 and the die pad 63, 73 of the Cu alloy. Even if the chip size is large, chip cracking can be prevented. Manufacturing of the power semiconductor package 69, 79 is easy as compared with the case where the internally built void portions 54 are provided as shown in FIG. 10. Thus, the yield rate of the lead frame member can be enhanced.

Next, FIG. 14 shows data indicating evaluation results of solidus and liquidus temperatures of Bi—Ag—Sb alloy based joining materials according to this embodiment. It was proved that the solidus temperature is lower than 270° C. when the Sb content is not higher than 3 wt %, but the solidus temperature can be made higher than 270° C. and the liquidus temperature can be made not higher than 400° C. when the Sb content is not lower than 5-20 wt %. As a result of evaluation of assembly of transistor packages (semiconductor apparatus) with this composition, it could be confirmed that the transistor packages can endure reflow at 260° C. when the solidus temperature is not lower than 270° C.

FIG. 15 shows evaluation results of solidus and liquidus temperatures of Sn—Sb—Ag—Cu alloy based joining materials according to this embodiment. It was proved that the solidus temperature can be made not lower than 270° C. and the liquidus temperature can be made not higher than 400° C. if the Sb/(Sn+Sb) content is set as 41-54 wt % when the (Ag+Cu) content is 16.4-19.5 wt %. In the same manner as in the Bi—Ag—Sb alloy based joining materials, as a result of evaluation of assembly of transistor packages (semiconductor apparatus) with this composition, it could be confirmed that the transistor packages can endure reflow at 260° C. when the solidus temperature is not lower than 270° C.

A power semiconductor package 140 which is a semiconductor apparatus according to a modification shown in FIG. 17 shows an example in which the present invention is applied to a MOS (Metal Oxide Semiconductor) type transistor package in which electrodes on the opposite surfaces are joined by solder.

Description will be made about the structure of the power semiconductor package 140. A thermal stress reduction plate 134 constituted by a Cu/Fe—Ni alloy/Cu laminate (thickness ratio is 1:1:1, and the average coefficient of thermal expansion is 10-11 ppm/k) and serving as a means for reducing thermal stress is inserted between each electrode 133d on the back surface 133b side (lower side) of a semiconductor chip 133 and a die pad 131. The junctions on the upper and lower sides of the thermal stress reduction plate 134 are joined by Sn-35Sb-11Ag-9Cu solders 135 and 136. On the other hand, each electrode 133c on the main surface 133a side (circuit side) is metalized with Cr/Ni on an Al pad or plated with Ni on an Al pad treated with zincate. Each electrode 133c is joined to each lead 132 serving as an external connection terminal by Sn-35Sb-11Ag-9Cu solder 137, 138 similar to that for die bonding.

The lead 132 is constituted by a Cu/Fe—Ni alloy/Cu laminate low in thermal expansion and high in electric conductivity, which is similar to the thermal stress reduction plate 134. The assembling process before die bonding is the same as the assembling process shown in FIG. 4. The junctions of the electrodes 133c on the main surface 133a are cooled down to 300° C. or lower after die bonding at 360-380° C. In that state, paste solder is supplied onto the electrodes 133c. Further, a lead frame member having a plurality of leads 132 integrated therein is aligned and disposed. A heat block is pressed onto the lead frame member from above so as to join a plurality of semiconductor chips 133 in a lump. Finally, resin encapsulation is performed by transfer molding so as to form an encapsulant 139. After that, the die pad 131 and the leads 132 are cut off from the lead frame member individually. Thus, the power semiconductor package 140 is completed.

In the power semiconductor package 140 according to the modification shown in FIG. 17, all the connection portions inside the package are joined by Pb free solder. Accordingly, it is possible to provide a transistor package having no adverse influence on environment. In addition, each source electrode (electrode 133c) and each lead 132 are joined by the Sn-35Sb-11Ag-9Cu solder 137 over a wide area. Accordingly, it is possible to provide a package low in electric resistance in each connection portion and hence low in loss. Further, compared with bonding with Al wires, the thickness size above the chip can be reduced, and the bonding area of each lead 132 can be omitted. As a result, it is possible to reduce the package size.

In semiconductor apparatus according to a modification shown in FIGS. 18 and 19, the present invention is applied to a multi-chip package 151 to be assembled using a lead frame member.

Description will be made about the structure of the multi-chip package 151. The multi-chip package 151 is assembled out of the lead frame member constituted by a plurality of leads 144 serving as external connection terminals, and a plurality of die pads 141, 142 and 143. One semiconductor chip 146 is die-bonded to each die pad. That is, the multi-chip package 151 is a semiconductor apparatus in which a plurality of semiconductor chips 146 are incorporated.

A low-thermal-expansion thermal stress reduction plate 147 serving as a means for reducing thermal stress is inserted between each die pad and each semiconductor chip 146, and joined thereto by Sn—Sb—Ag—Cu solders 148 and 149. Each electrode 146c on the main surface 146a side (circuit surface side) of the semiconductor chip 146 and each lead 144 or each die pad necessary to be electrically connected are connected by wire bonding with an Al wire 150. On the other hand, each electrode 146d of a back surface 146b is connected to the die pad through the Sn—Sb—Ag—Cu solder 148, the thermal stress reduction plate 147 and the Sn—Sb—Ag—Cu solder 149. Further, the semiconductor chips 146, the Al wires 150, the solders and parts of the leads 144 and the die pads are encapsulated with an encapsulant 145 formed out of encapsulating resin.

According to the multi-chip package 151 according to the modification shown in FIGS. 18 and 19, it is possible to provide a high-function and Pb-free-solder semiconductor package constituted by a plurality of semiconductor chips 146. Further, since die bonding is performed by metal junction, the semiconductor package is environmental and the reliability of power cycles or temperature cycles can be enhanced. In addition, due to use of high-melting solder, there is an advantage that the semiconductor package is excellent as to high-temperature reliability.

The invention developed by the present inventor has been described above specifically based on embodiments of the invention. Not to say, the present invention is not limited to the embodiments of the invention, but various changes can be made on the invention without departing from the substance of the invention.

For example, the embodiments has been described chiefly in the case where the semiconductor apparatus is a transistor package (power semiconductor package), but the semiconductor apparatus is not limited to the transistor package.

The present invention is suitable to a semiconductor apparatus and a technology for manufacturing the semiconductor apparatus.

The aforementioned description has been made about the embodiments. However, the present invention is not limited to the embodiments, but it is obvious to those skilled in the art that various changes and modifications can be made without departing from the spirit of the present invention and the accompanying claims.

The invention claimed is:

1. A semiconductor apparatus characterized by comprising:
   a semiconductor device having a main surface, a back surface opposite to the main surface, an electrode formed on the main surface, an electrode formed on the back surface, and a circuit formed on the main surface;
   a conductive die pad to be joined to the electrode of the back surface of the semiconductor device;
   a conductive lead to be electrically connected to the electrode of the main surface of the semiconductor device;

an encapsulant to encapsulate the semiconductor device, the die pad and a part of the lead; and a means for reducing thermal stress, which means is disposed between the semiconductor device and the die pad and which is lower in thermal expansion, lower in yield stress or lower in elastic modulus than a main material forming the die pad;

wherein the semiconductor device and the means for reducing thermal stress are joined by a joint material of a Pb free solder alloy having Sn—Sb—Ag—Cu as its main constituent elements, having a solidus temperature not lower than 270° C. and a liquidus temperature not higher than 400° C.

2. A semiconductor apparatus according to claim 1, characterized in that the main material forming the die pad and the lead is a Cu alloy.

3. A semiconductor apparatus according to claim 2, characterized in that the means for reducing thermal stress is a sheet made of a composite material having a coefficient of thermal expansion of 8-12 ppm/k.

4. A semiconductor apparatus according to claim 1, characterized in that the means for reducing thermal stress is a sheet larger than the semiconductor device and smaller than the die pad as to length and width in a plane.

5. A semiconductor apparatus according to claim 1, characterized in that the Pb free solder alloy having Sn—Sb—Ag—Cu as its main constituent elements has a composition satisfying conditions of 43 wt %$\leqq$Sb/(Sn+Sb)$\leqq$48 wt % and 15 wt %$\leqq$(Ag+Cu)$\leqq$25 wt %.

6. A semiconductor apparatus according to claim 1, characterized in that a circuit of a transistor device is formed in the main surface of the semiconductor device.

7. A semiconductor apparatus according to claim 1, characterized in that a plurality of semiconductor devices similar to said semiconductor device are incorporated.

8. A semiconductor apparatus comprising a vertical semiconductor device, a die pad of a Cu alloy to be joined to an electrode of a back surface of the semiconductor device, a first lead of the Cu alloy to be electrically connected to a main electrode on a circuit side of the semiconductor device, a second lead of the Cu alloy to be electrically connected to a control electrode on the circuit side of the semiconductor device, and a resin encapsulant for covering the semiconductor device, and parts of the die pad and the first and second leads;

the semiconductor apparatus being characterized in that a means for reducing thermal stress, which is lower in thermal expansion, lower in yield stress or lower in elastic modulus than the Cu alloy, is disposed between the die pad and the semiconductor device, and the semiconductor device and the means for reducing thermal stress are joined by a joint material of a Pb free solder alloy having Sn—Sb—Ag—Cu as its main constituent elements or an alloy having Bi—Ag—Sb as its main constituent elements.

9. A semiconductor apparatus according to claim 8, characterized in that the means for reducing thermal stress is a sheet made of a composite material having a coefficient of thermal expansion of 8-12 ppm/k.

10. A semiconductor apparatus according to claim 8, characterized in that the means for reducing thermal stress is a sheet larger than the semiconductor device and smaller than the die pad as to length and width in a plane.

11. A semiconductor apparatus according to claim 8, characterized in that the Pb free solder alloy having Sn—Sb—Ag—Cu as its main constituent elements has a composition satisfying conditions of 43 wt %$\leqq$Sb/(Sn+Sb)$\leqq$48 wt % and 15 wt %$\leqq$(Ag+Cu)$\leqq$25 wt %.

* * * * *